_(12)_ United States Patent
Yamada

(10) Patent No.: US 11,736,134 B2
(45) Date of Patent: Aug. 22, 2023

(54) DIGITAL ISOLATOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Nobuhide Yamada, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/525,285

(22) Filed: Nov. 12, 2021

(65) Prior Publication Data

US 2022/0285490 A1    Sep. 8, 2022

(30) Foreign Application Priority Data

Mar. 2, 2021  (JP) ................... 2021-032765

(51) Int. Cl.
| | |
|---|---|
| *H04B 1/16* | (2006.01) |
| *H01L 23/64* | (2006.01) |
| *H04B 1/04* | (2006.01) |
| *H01F 27/28* | (2006.01) |

(Continued)

(52) U.S. Cl.
CPC ............ *H04B 1/16* (2013.01); *H01F 27/28* (2013.01); *H01L 23/645* (2013.01); *H01L 28/10* (2013.01); *H04B 1/04* (2013.01); *H04L 25/0266* (2013.01); *H01F 27/2871* (2013.01)

(58) Field of Classification Search
CPC combination set(s) only.
See application file for complete search history.

(56) References Cited

U.S. PATENT DOCUMENTS

| | | |
|---|---|---|
| 6,603,807 B1 | 8/2003 | Yukutake et al. |
| 9,761,545 B2 | 9/2017 | Sin et al. |
| (Continued) | | |

FOREIGN PATENT DOCUMENTS

| | | |
|---|---|---|
| DE | 11 2015 005 198 T5 | 7/2017 |
| JP | 11 -31 7445 A | 11/1999 |
| (Continued) | | |

*Primary Examiner* — Farun Lu
*Assistant Examiner* — Mohammad A Rahman
(74) *Attorney, Agent, or Firm* — Oblon, McClelland, Maier & Neustadt, L.L.P.

(57) ABSTRACT

A digital isolator according to an embodiment includes a first electrode, a first insulating part, a second electrode, a second insulating part, and a first dielectric part. The first insulating part is located under the first electrode. The second electrode is located under the first insulating part. The second insulating part is located around the first electrode along a first plane perpendicular to a first direction. The first direction is from the second electrode toward the first electrode. The first dielectric part is located between the first electrode and the second insulating part in a second direction along the first plane. The first dielectric part contacts the first electrode. A relative dielectric constant of the first dielectric part is greater than a relative dielectric constant of the first insulating part.

6 Claims, 2 Drawing Sheets

(51) Int. Cl.
*H04L 25/02* (2006.01)
*H01L 49/02* (2006.01)

(56) References Cited

U.S. PATENT DOCUMENTS

| | | | |
|---|---|---|---|
| 11,409,143 B1* | 8/2022 | Landig | C08J 9/286 |
| 2015/0364249 A1 | 12/2015 | Palumbo et al. | |

FOREIGN PATENT DOCUMENTS

| | | | |
|---|---|---|---|
| JP | 2016-6816 A | 4/2016 | |
| JP | 2017-538277 A | 12/2017 | |

* cited by examiner

DIGITAL ISOLATOR

CROSS-REFERENCE TO RELATED APPLICATIONS

This application is based upon and claims the benefit of priority from Japanese Patent Application No. 2021-032765, filed on Mar. 2, 2021; the entire contents of which are incorporated herein by reference.

FIELD

Embodiments described herein relate generally to a digital isolator.

BACKGROUND

A digital isolator transmits a signal by utilizing the change of a magnetic field or an electric field in a state in which the current is blocked. It is desirable to increase the resistance to dielectric breakdown of the digital isolator.

DETAILED DESCRIPTION

Figure 1:
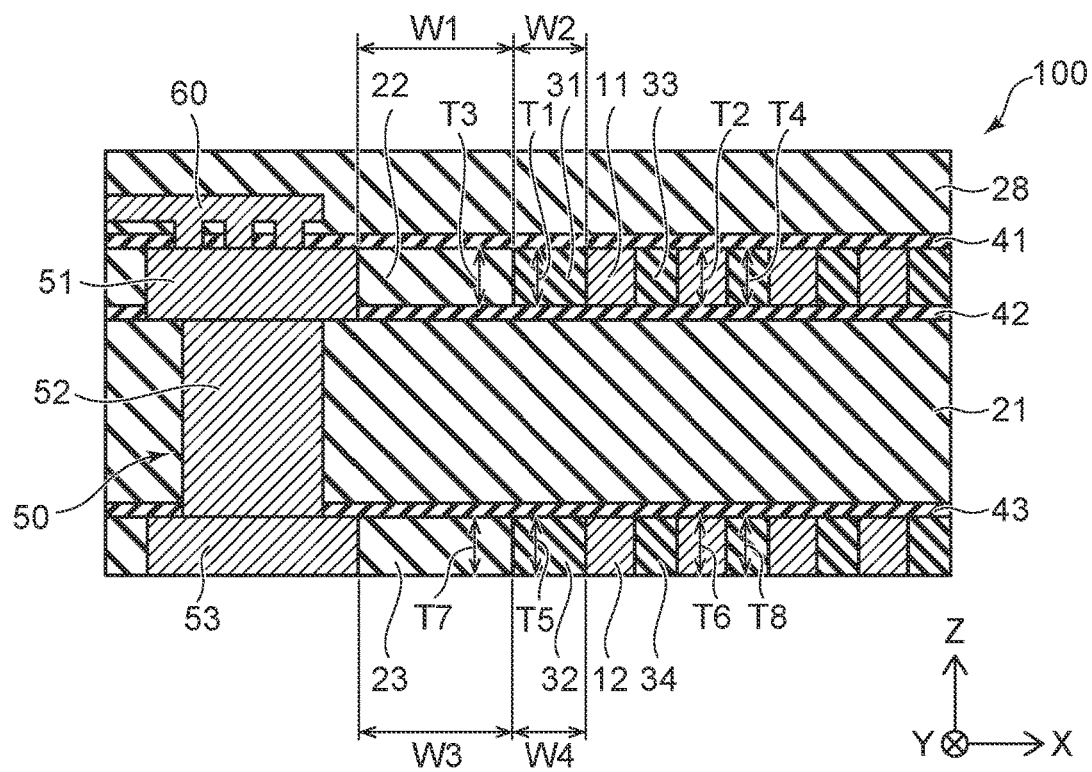
FIG. 1 is a cross-sectional view illustrating a digital isolator according to a first embodiment.

A digital isolator according to an embodiment includes a first electrode, a first insulating part, a second electrode, a second insulating part, and a first dielectric part. The first insulating part is located under the first electrode. The second electrode is located under the first insulating part. The second insulating part is located around the first electrode along a first plane perpendicular to a first direction; and the first direction is from the second electrode toward the first electrode. The first dielectric part is located between the first electrode and the second insulating part in a second direction along the first plane and contacts the first electrode. A relative dielectric constant of the first dielectric part is greater than a relative dielectric constant of the first insulating part.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals; and a detailed description is omitted as appropriate.

First Embodiment

FIG. 1 is a cross-sectional view illustrating a digital isolator according to a first embodiment.

As illustrated in FIG. 1, the digital isolator 100 according to the first embodiment includes a first electrode 11, a second electrode 12, a first insulating part 21, a second insulating part 22, a third insulating part 23, an upper insulating part 28, a first dielectric part 31, a second dielectric part 32, a first intermediate dielectric part 33, a second intermediate dielectric part 34, insulating layers 41 to 43, and a conductive body 50.

An XYZ orthogonal coordinate system is used in the description of the embodiments. The direction from the second electrode 12 toward the first electrode 11 is taken as a Z-direction (a first direction). Two mutually-orthogonal directions perpendicular to the Z-direction are taken as an X-direction (a second direction) and a Y-direction (a third direction). In the description, the direction from the second electrode 12 toward the first electrode 11 is called "up", and the opposite direction is called "down". These directions are based on the relative positional relationship between the first electrode 11 and the second electrode 12 and are independent of the direction of gravity.

The first insulating part 21 is located under the first electrode 11. The second electrode 12 is located under the first insulating part 21. That is, the first insulating part 21 is located between the first electrode 11 and the second electrode 12 in the Z-direction. Thereby, the first electrode 11 and the second electrode 12 are electrically isolated from each other. The first electrode 11 and the second electrode 12 face each other in the Z-direction. At least a portion of the second electrode 12 overlaps at least a portion of the first electrode 11 in the Z-direction.

The second insulating part 22 is located around the first electrode 11 along the X-Y plane (a first plane) perpendicular to the Z-direction. The third insulating part 23 is located around the second electrode 12 along the X-Y plane (a second plane) perpendicular to the Z-direction.

The first dielectric part 31 is located between the first electrode 11 and the second insulating part 22 in the X-direction and the Y-direction. The first dielectric part 31 contacts the first electrode 11. The relative dielectric constant of the first dielectric part 31 is greater than the relative dielectric constant of the first insulating part 21.

The second dielectric part 32 is located between the second electrode 12 and the third insulating part 23 in the X-direction and the Y-direction. The second dielectric part 32 contacts the second electrode 12. The relative dielectric constant of the second dielectric part 32 is greater than the relative dielectric constant of the first insulating part 21.

In the example, the first electrode 11 and the second electrode 12 are coils that have spiral shapes along the X-Y plane. That is, the digital isolator 100 is a magnetically coupled digital isolator. The first electrode 11 and the second electrode 12 may be flat-plate electrodes along the X-Y plane. That is, the digital isolator 100 may be a capacitively coupled digital isolator.

The first intermediate dielectric part 33 is located along the X-Y plane between the coil of the first electrode 11. The relative dielectric constant of the first intermediate dielectric part 33 is greater than the relative dielectric constant of the first insulating part 21. The second intermediate dielectric part 34 is located along the X-Y plane between the coil of the second electrode 12. The relative dielectric constant of the second intermediate dielectric part 34 is greater than the relative dielectric constant of the first insulating part 21.

The insulating layer 41 is located on the first electrode 11. The insulating layer 41 is located between the first electrode 11 and the upper insulating part 28 in the Z-direction. For example, the insulating layer 41 contacts the first electrode 11. The insulating layer 42 is located under the first electrode 11. The insulating layer 42 is located between the first electrode 11 and the first insulating part 21 in the Z-direction. For example, the insulating layer 42 contacts the first electrode 11. The insulating layer 43 is located on the second electrode 12. The insulating layer 43 is located between the second electrode 12 and the first insulating part 21 in the Z-direction. For example, the insulating layer 43 contacts the second electrode 12.

The conductive body 50 is located at a position separated from the first and second electrodes 11 and 12 in the X-direction. For example, the conductive body 50 is located around the first electrode 11 and the second electrode 12 along the first plane. In the example, the conductive body 50 includes a first conductive portion 51, a second conductive portion 52, and a third conductive portion 53.

The first conductive portion 51 is located at a position separated from the first electrode 11 in the X-direction. The second insulating part 22 and the first dielectric part 31 are positioned between the first conductive portion 51 and the first electrode 11 in the X-direction. The second insulating part 22 contacts the first conductive portion 51. The second conductive portion 52 is located under the first conductive portion 51. The first insulating part 21 contacts the second conductive portion 52. The third conductive portion 53 is located under the second conductive portion 52. The third conductive portion 53 is located at a position separated from the second electrode 12 in the X-direction. The third insulating part 23 and the second dielectric part 32 are positioned between the third conductive portion 53 and the second electrode 12 in the X-direction. The third insulating part 23 contacts the third conductive portion 53.

A portion of the insulating layer 41 is located on the first conductive portion 51. For example, a portion of the insulating layer 41 contacts the first conductive portion 51. A portion of the insulating layer 42 is located around the bottom portion of the first conductive portion 51 along the X-Y plane. For example, a portion of the insulating layer 42 contacts the first conductive portion 51. A portion of the insulating layer 43 is located around the bottom portion of the second conductive portion 52 along the X-Y plane. For example, a portion of the insulating layer 43 contacts the second and third conductive portions 52 and 53.

The two ends of the first electrode 11 (the two ends of the coil) are electrically connected with a not-illustrated first circuit via wiring. The two ends of the second electrode 12 (the two ends of the coil) are electrically connected with a not-illustrated second circuit via wiring.

In the example, the second electrode 12 is electrically connected with the second circuit via the conductive body 50. That is, in the example, the conductive body 50 functions as an electrode for drawing out the wiring of the second electrode 12 upward. For example, the second electrode 12 is electrically connected to the conductive body 50 via the third conductive portion 53. For example, the conductive body 50 is electrically connected with the second circuit via a connection part 60 that contacts the first conductive portion 51 above the first conductive portion 51. The conductive body 50 may not be electrically connected with the second electrode 12. For example, the conductive body 50 may be an electrode, a circuit, or the like of a component that is next to the digital isolator 100.

The upper insulating part 28 is located on the first electrode 11 and the conductive body 50. More specifically, the upper insulating part 28 is located on the first electrode 11, the first intermediate dielectric part 33, the first dielectric part 31, the second insulating part 22, and the first conductive portion 51. The connection part 60 is located inside the upper insulating part 28.

One of the first circuit or the second circuit is used as a transmitting circuit. The other of the first circuit or the second circuit is used as a receiving circuit. In the description herein, the first circuit is a transmitting circuit; and the second circuit is a receiving circuit.

The first circuit transmits, to the first electrode 11, a wave-like signal (current) suited to the transmission. When a current flows through the first electrode 11, a magnetic field that passes through the spiral first electrode 11 is generated. At least a portion of the first electrode 11 is arranged with at least a portion of the second electrode 12 in the Z-direction. A portion of the generated magnetic force lines passes through the second electrode 12. An induced electromotive force is generated in the second electrode 12 by the change of the magnetic field within the second electrode 12, and a current flows through the second electrode 12. The second circuit detects the current flowing through the second electrode 12 and generates a signal corresponding to the detection result. Thereby, the signal or energy is transmitted in the state in which the current is blocked (insulated) between the first electrode 11 and the second electrode 12.

Examples of the materials of the components of the digital isolator 100 will now be described.

The first electrode 11, the second electrode 12, and the conductive body 50 include, for example, a metal. The first electrode 11, the second electrode 12, and the conductive body 50 include, for example, at least one metal selected from the group consisting of copper and aluminum.

The first insulating part 21, the second insulating part 22, the third insulating part 23, and the upper insulating part 28 include silicon and oxygen. The first insulating part 21, the second insulating part 22, the third insulating part 23, and the upper insulating part 28 include, for example, silicon oxide. The first insulating part 21, the second insulating part 22, the third insulating part 23, and the upper insulating part 28 may further include carbon or nitrogen.

The insulating layers 41 to 43 include silicon and nitrogen. The insulating layers 41 to 43 include, for example, silicon nitride. The insulating layers 41 to 43 may further include carbon.

The first dielectric part 31, the second dielectric part 32, the first intermediate dielectric part 33, and the second intermediate dielectric part 34 include, for example, silicon and nitrogen. The first dielectric part 31, the second dielectric part 32, the first intermediate dielectric part 33, and the second intermediate dielectric part 34 include, for example, silicon nitride. The first dielectric part 31, the second dielectric part 32, the first intermediate dielectric part 33, and the second intermediate dielectric part 34 may further include carbon.

The relative dielectric constant of the first dielectric part 31 is greater than the relative dielectric constant of the first insulating part 21. For example, the relative dielectric constant of the first dielectric part 31 is greater than the relative dielectric constant of the second insulating part 22. The relative dielectric constant of the second dielectric part 32 is greater than the relative dielectric constant of the first insulating part 21. For example, the relative dielectric constant of the second dielectric part 32 is greater than the relative dielectric constant of the third insulating part 23. For example, the relative dielectric constant of the first dielectric part 31 and the relative dielectric constant of the second dielectric part 32 are equal. The relative dielectric constant of the first dielectric part 31 and the relative dielectric constant of the second dielectric part 32 may be different from each other.

The relative dielectric constant of the first intermediate dielectric part 33 is greater than the relative dielectric constant of the first insulating part 21. For example, the relative dielectric constant of the first intermediate dielectric part 33 and the relative dielectric constant of the first dielectric part 31 are equal. The relative dielectric constant of the first intermediate dielectric part 33 and the relative dielectric constant of the first dielectric part 31 may be different from each other. The relative dielectric constant of the second intermediate dielectric part 34 is greater than the relative dielectric constant of the first insulating part 21. For example, the relative dielectric constant of the second intermediate dielectric part 34 and the relative dielectric constant of the second dielectric part 32 are equal. The relative dielectric constant of the second intermediate dielectric part 34 and the relative dielectric constant of the second dielectric part 32 may be different from each other. For example, the relative dielectric constant of the first intermediate dielectric part 33 and the relative dielectric constant of the second intermediate dielectric part 34 are equal. The relative dielectric constant of the first intermediate dielectric part 33 and the relative dielectric constant of the second intermediate dielectric part 34 may be different from each other.

A width W1 in the X-direction of the second insulating part 22 is, for example, greater than a width W2 in the X-direction of the first dielectric part 31. The width W2 is, for example, less than half of the distance in the X-direction between the first electrode 11 and the conductive body 50 (the first conductive portion 51). A width W3 in the X-direction of the third insulating part 23 is, for example, greater than a width W4 in the X-direction of the second dielectric part 32. The width W4 is, for example, less than half of the distance in the X-direction between the second electrode 12 and the conductive body 50 (the third conductive portion 53). For example, the width W2 and the width W4 are equal. The width W2 and the width W4 may be different from each other.

A thickness T1 in the Z-direction of the first dielectric part 31 is, for example, equal to a thickness T2 in the Z-direction of the first electrode 11. The thickness T1 is, for example, equal to a thickness T3 in the Z-direction of the second insulating part 22. The thickness T1 is, for example, equal to a thickness T4 in the Z-direction of the first intermediate dielectric part 33. A thickness T5 in the Z-direction of the second dielectric part 32 is, for example, equal to a thickness T6 in the Z-direction of the second electrode 12. The thickness T5 is, for example, equal to a thickness T7 in the Z-direction of the third insulating part 23. The thickness T5 is, for example, equal to a thickness T8 in the Z-direction of the second intermediate dielectric part 34.

Effects of the first embodiment will now be described.

A potential difference occurs between the first electrode 11 and the second electrode 12 when a signal is transmitted between the first electrode 11 and the second electrode 12. Thereby, electric field concentration occurs at the vicinity of the lower end of the first electrode 11 and the vicinity of the upper end of the second electrode 12; and there is a risk that dielectric breakdown may occur. Electric field concentration also may occur at the vicinity of the lower end of the first electrode 11 and the vicinity of the upper end of the second electrode 12 due to the drive voltages of the first and second circuits, the potential difference between the first circuit and the second circuit, an unexpected high voltage or surge generated in the first circuit and/or the second circuit, etc.; and there is a risk that dielectric breakdown may occur.

For example, it may be considered to increase the thickness in the Z-direction of the first insulating part 21 in order to increase the resistance to dielectric breakdown. However, when the thickness in the Z-direction of the first insulating part 21 is increased, there is a risk that the warp of the substrate (e.g., a wafer or the like) on which the digital isolator is formed in the manufacturing processes may increase, and the manufacturing cost may increase.

Conversely, in the digital isolator 100 according to the first embodiment, the lines of electric force between the first electrode 11 and the second electrode 12 can be drawn out to the first dielectric part 31 side by providing the first dielectric part 31 that has a higher relative dielectric constant than the first insulating part 21 at a position next to the first electrode 11. The electric field concentration at the vicinity of the lower end of the first electrode 11 is relaxed thereby, and the resistance to dielectric breakdown can be improved without increasing the thickness in the Z-direction of the first insulating part 21.

For example, compared to when the entire region between the first electrode 11 and the conductive body 50 is set to be the first dielectric part 31, the resistance to dielectric breakdown can be improved by providing both the second insulating part 22 and the first dielectric part 31 between the first electrode 11 and the conductive body 50 because the second insulating part 22 has a superior breakdown voltage. Also, the resistance to dielectric breakdown can be further improved by setting the width W1 in the X-direction of the second insulating part 22 to be greater than the width W2 in the X-direction of the first dielectric part 31 because the second insulating part 22 has a superior breakdown voltage.

The lines of electric force between the first electrode 11 and the second electrode 12 can be drawn out to the first intermediate dielectric part 33 side by providing the first intermediate dielectric part 33 that has a higher relative dielectric constant than the first insulating part 21 between the coil of the first electrode 11. The electric field concentration at the vicinity of the lower end of the first electrode 11 is further relaxed thereby, and the resistance to dielectric breakdown can be further improved.

Similarly, the lines of electric force between the first electrode 11 and the second electrode 12 can be drawn out to the second dielectric part 32 side by providing the second dielectric part 32 that has a higher relative dielectric constant than the first insulating part 21 at a position next to the second electrode 12. The electric field concentration at the vicinity of the upper end of the second electrode 12 is relaxed thereby, and the resistance to dielectric breakdown can be improved without increasing the thickness in the Z-direction of the first insulating part 21.

For example, compared to when the entire region between the second electrode 12 and the conductive body 50 is set to be the second dielectric part 32, the resistance to dielectric breakdown can be improved by providing both the third insulating part 23 and the second dielectric part 32 between the second electrode 12 and the conductive body 50 because the third insulating part 23 has a superior breakdown voltage. Also, the resistance to dielectric breakdown can be further improved by setting the width W3 in the X-direction of the third insulating part 23 to be greater than the width W4 in the X-direction of the second dielectric part 32 because the third insulating part 23 has a superior breakdown voltage.

The lines of electric force between the first electrode 11 and the second electrode 12 can be drawn out to the second intermediate dielectric part 34 side by providing the second intermediate dielectric part 34 that has a higher relative dielectric constant than the first insulating part 21 between the coil of the second electrode 12. The electric field concentration at the vicinity of the upper end of the second electrode 12 can be further relaxed thereby, and the resistance to dielectric breakdown can be further improved.

Second Embodiment

Figure 2:
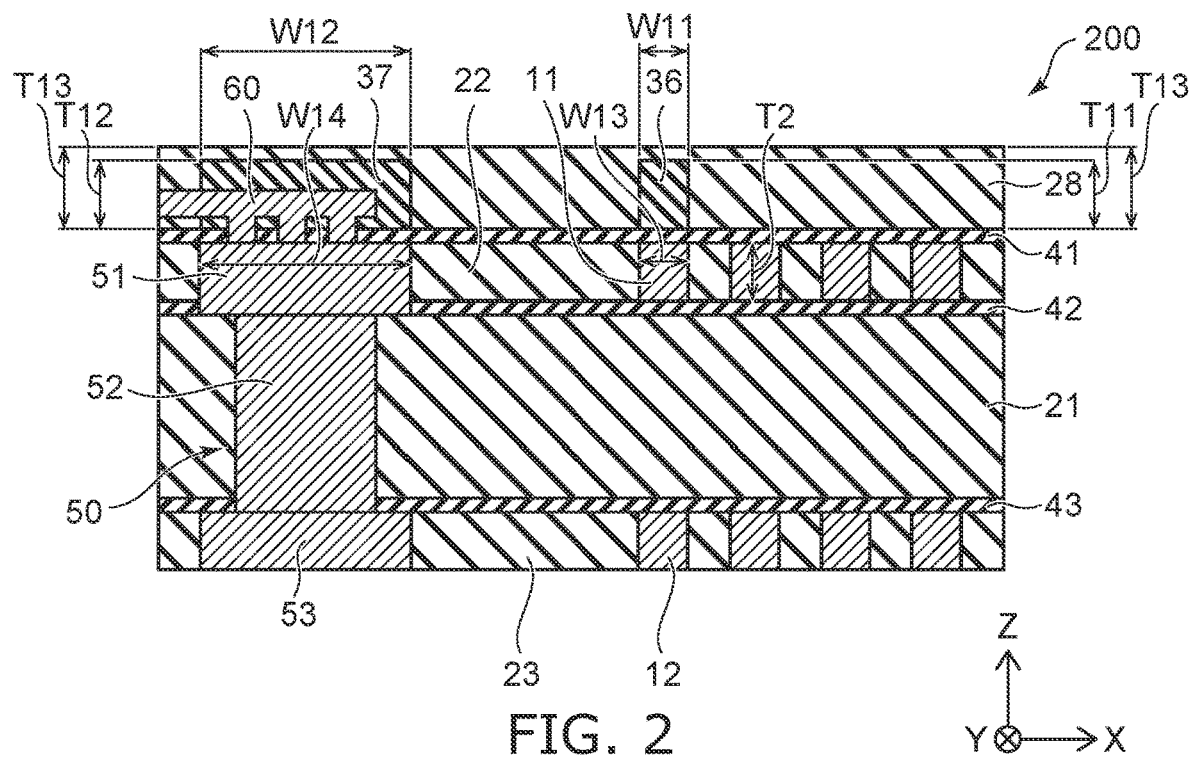
FIG. 2 is a cross-sectional view illustrating a digital isolator according to a second embodiment.

FIG. 2 is a cross-sectional view illustrating a digital isolator according to a second embodiment.

As illustrated in FIG. 2, the digital isolator 200 according to the second embodiment includes the first electrode 11, the second electrode 12, the first insulating part 21, the second insulating part 22, the third insulating part 23, the upper insulating part 28, a first dielectric layer 36, a second dielectric layer 37, the insulating layers 41 to 43, and the conductive body 50.

The digital isolator 200 according to the second embodiment does not include the first dielectric part 31, the second dielectric part 32, the first intermediate dielectric part 33, and the second intermediate dielectric part 34, but includes a first dielectric layer 36 and a second dielectric layer 37; otherwise, the digital isolator 200 is the same as the digital isolator 100 according to the first embodiment. A description of similar configurations is omitted.

The second insulating part 22 is located over the entire region between the first electrode 11 and the conductive body 50. The second insulating part 22 also is located between the coil of the first electrode 11. The third insulating part 23 is located over the entire region between the second electrode 12 and the conductive body 50. The third insulating part 23 also is located between the coil of the second electrode 12.

The first dielectric layer 36 and the second dielectric layer 37 each are located inside the upper insulating part 28. The first dielectric layer 36 is positioned on one of the first electrode 11 or the conductive body 50. The second dielectric layer 37 is positioned on the other of the first electrode 11 or the conductive body 50. In the example, the first dielectric layer 36 is located on the first electrode 11; and the second dielectric layer 37 is located on the conductive body 50.

The first dielectric layer 36 and the second dielectric layer 37 include, for example, silicon and nitrogen. The first dielectric layer 36 and the second dielectric layer 37 include, for example, silicon nitride. The first dielectric layer 36 and the second dielectric layer 37 may further include carbon.

The relative dielectric constant of the first dielectric layer 36 is greater than the relative dielectric constant of the second insulating part 22. The relative dielectric constant of the first dielectric layer 36 is, for example, greater than the relative dielectric constant of the upper insulating part 28. The relative dielectric constant of the second dielectric layer 37 is greater than the relative dielectric constant of the second insulating part 22. The relative dielectric constant of the second dielectric layer 37 is, for example, greater than the relative dielectric constant of the upper insulating part 28. For example, the relative dielectric constant of the first dielectric layer 36 and the relative dielectric constant of the second dielectric layer 37 are equal. The relative dielectric constant of the first dielectric layer 36 and the relative dielectric constant of the second dielectric layer 37 may be different from each other.

A width W11 in the X-direction of the first dielectric layer 36 is, for example, equal to a width W13 in the X-direction of the coil portion of the first electrode 11. The width W11 may be, for example, greater than the width W13. A width W12 in the X-direction of the second dielectric layer 37 is, for example, equal to a width W14 in the X-direction of the first conductive portion 51. The width W12 may be, for example, greater than the width W14.

A thickness T11 in the Z-direction of the first dielectric layer 36 is, for example, not more than a thickness T13 in the Z-direction of the upper insulating part 28. The thickness T11 is, for example, about equal to the thickness T2 in the Z-direction of the first electrode 11. The thickness T11 may be greater than the thickness T2 or less than the thickness T2. A thickness T12 in the Z-direction of the second dielectric layer 37 is, for example, not more than the thickness T13. The thickness T12 is, for example, about equal to the thickness T2. The thickness T12 may be greater than the thickness T2 or less than the thickness T2.

Effects of the second embodiment will now be described.

When the conductive body 50 is located at the vicinity of the first and second electrodes 11 and 12, a potential difference occurs between the first electrode 11 and the conductive body 50 when a signal is transmitted between the first electrode 11 and the second electrode 12. Thereby, electric field concentration occurs at the vicinity of the side end of the first electrode 11 and at the vicinity of the side end of the conductive body 50; and there is a risk that dielectric breakdown may occur. Also, electric field concentration occurs at the vicinity of the side end of the first electrode 11 and the vicinity of the side end of the conductive body 50 due to the drive voltages of the first and second circuits, the potential difference between the first circuit and the second circuit, an unexpected high voltage or surge generated in the first circuit and/or the second circuit, etc.; and there is a risk that dielectric breakdown may occur.

For example, it may be considered to increase the distance between the first electrode 11 and the conductive body 50 in order to increase the resistance to dielectric breakdown. However, when the distance between the first electrode 11 and the conductive body 50 is increased, there is a risk that the chip area may be increased. An increase of the chip area may cause an increase of the manufacturing cost.

Conversely, in the digital isolator 200 according to the second embodiment, the lines of electric force between the first electrode 11 and the conductive body 50 can be drawn out to the first dielectric layer 36 side by providing the first dielectric layer 36 that has a higher relative dielectric constant than the second insulating part 22 on one of the first electrode 11 or the conductive body 50. The electric field concentration at the vicinity of the side end of one of the first electrode 11 or the conductive body 50 is relaxed thereby, and the resistance to dielectric breakdown can be improved without increasing the chip area.

Similarly, the lines of electric force between the first electrode 11 and the conductive body 50 can be drawn out to the second dielectric layer 37 side by providing the second dielectric layer 37 that has a higher relative dielectric constant than the second insulating part 22 on the other of the first electrode 11 or the conductive body 50. The electric field concentration at the vicinity of the side end of the other of the first electrode 11 or the conductive body 50 is relaxed thereby, and the resistance to dielectric breakdown can be improved without increasing the chip area.

When the conductive body 50 and the second electrode 12 are not electrically connected, there is a risk that a potential difference may occur between the second electrode 12 and the conductive body 50. In such a case, for example, dielectric layers may be located below the second electrode 12 and below the third conductive portion 53. When these dielectric layers are provided, the relative dielectric constants of these dielectric layers are set to be greater than the relative dielectric constant of the third insulating part 23.

Similarly to when the first dielectric layer 36 and the second dielectric layer 37 described above are provided, the electric field concentration between the second electrode 12 and the conductive body 50 is relaxed thereby, and the resistance to dielectric breakdown can be improved without increasing the chip area.

Third Embodiment

Figure 3:
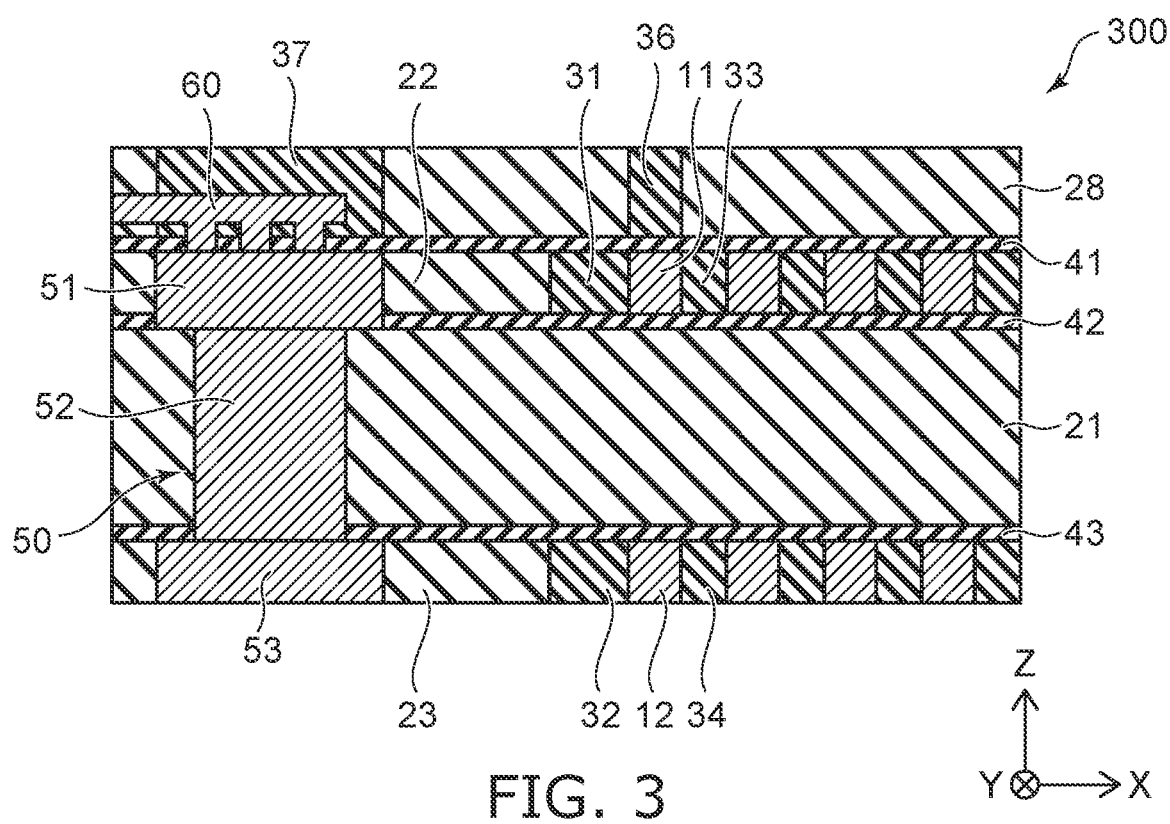
FIG. 3 is a cross-sectional view illustrating a digital isolator according to a third embodiment.

FIG. 3 is a cross-sectional view illustrating a digital isolator according to a third embodiment.

As illustrated in FIG. 3, the digital isolator 300 according to the third embodiment includes the first electrode 11, the second electrode 12, the first insulating part 21, the second insulating part 22, the third insulating part 23, the upper insulating part 28, the first dielectric part 31, the second dielectric part 32, the first intermediate dielectric part 33, the second intermediate dielectric part 34, the first dielectric layer 36, the second dielectric layer 37, the insulating layers 41 to 43, and the conductive body 50.

The digital isolator 300 according to the third embodiment includes the first and second dielectric layers 36 and 37 of the digital isolator 200 according to the second embodiment in addition to the first dielectric part 31, the second dielectric part 32, the first intermediate dielectric part 33, and the second intermediate dielectric part 34 of the digital isolator 100 according to the first embodiment. The configurations of the components are the same as those of the first and second embodiments; and a description is therefore omitted.

In the digital isolator 300 according to the third embodiment as well, the electric field concentration at the vicinity of the lower end of the first electrode 11 and the vicinity of the upper end of the second electrode 12 is relaxed by providing the first dielectric part 31, the second dielectric part 32, the first intermediate dielectric part 33, and the second intermediate dielectric part 34; and the resistance to dielectric breakdown can be improved without increasing the thickness in the Z-direction of the first insulating part 21.

In the digital isolator 300 according to the third embodiment as well, the electric field concentration at the vicinity of the side end of the first electrode 11 and the vicinity of the side end of the conductive body 50 is relaxed by providing the first dielectric layer 36 and the second dielectric layer 37; and the resistance to dielectric breakdown can be improved without increasing the chip area.

According to embodiments as described above, a digital isolator is provided in which the resistance to dielectric breakdown can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. Embodiments described above can be implemented in combination with each other.

What is claimed is:

1. A digital isolator, comprising:
a first electrode;
a first insulating part located under the first electrode;
a second electrode located under the first insulating part;
a second insulating part located around the first electrode along a first plane perpendicular to a first direction, the first direction being from the second electrode toward the first electrode; and
a first dielectric part located between the first electrode and the second insulating part in a second direction along the first plane,
the first dielectric part contacting the first electrode,
a relative dielectric constant of the first dielectric part being greater than a relative dielectric constant of the first insulating part.

2. The isolator according to claim 1, wherein
a width in the second direction of the second insulating part is greater than a width in the second direction of the first dielectric part.

3. The isolator according to claim 1, wherein
the first electrode is a coil that has a spiral shape along the first plane,
the isolator further comprises a first intermediate dielectric part located between the coil along the first plane, and
a relative dielectric constant of the first intermediate dielectric part is greater than the relative dielectric constant of the first insulating part.

4. The isolator according to claim 1, further comprising:
a third insulating part located around the second electrode along a second plane perpendicular to the first direction; and
a second dielectric part located between the second electrode and the third insulating part in the second direction,
the second dielectric part contacting the second electrode,
a relative dielectric constant of the second dielectric part being greater than the relative dielectric constant of the first insulating part.

5. The isolator according to claim 4, wherein
a width in the second direction of the third insulating part is greater than a width in the second direction of the second dielectric part.

6. The isolator according to claim 4, wherein
the second electrode is a coil that has a spiral shape along the second plane,
the isolator further comprises a second intermediate dielectric part located between the coil along the second plane, and
a relative dielectric constant of the second intermediate dielectric part is greater than the relative dielectric constant of the first insulating part.

* * * * *